(12) United States Patent
Kim

(10) Patent No.: US 10,460,651 B2
(45) Date of Patent: Oct. 29, 2019

(54) METHOD FOR DRIVING DISPLAY

(71) Applicant: SUNDIODE KOREA, Gwangju (KR)

(72) Inventor: James Chinmo Kim, Seoul (KR)

(73) Assignee: SUNDIODE KOREA (KR)

( * ) Notice: Subject to any disclaimer, the term of this patent is extended or adjusted under 35 U.S.C. 154(b) by 0 days.

(21) Appl. No.: 15/899,113

(22) Filed: Feb. 19, 2018

(65) Prior Publication Data

US 2018/0174506 A1    Jun. 21, 2018

Related U.S. Application Data

(63) Continuation-in-part of application No. PCT/KR2016/009147, filed on Aug. 19, 2016.

(30) Foreign Application Priority Data

Aug. 19, 2015   (KR) .................. 10-2015-0116386

(51) Int. Cl.
```
G09G 3/32      (2016.01)
H01L 27/32     (2006.01)
H01L 33/08     (2010.01)
H01L 33/36     (2010.01)
```

(52) U.S. Cl.
CPC ............ *G09G 3/32* (2013.01); *H01L 27/3211* (2013.01); *H01L 27/3237* (2013.01); *H01L 33/08* (2013.01); *H01L 33/36* (2013.01); *G09G 2310/0264* (2013.01)

(58) Field of Classification Search
None
See application file for complete search history.

(56) References Cited

U.S. PATENT DOCUMENTS

| | | | |
|---|---|---|---|
| 2009/0102828 A1* | 4/2009 | Arai ................... | G02B 26/0841 345/213 |
| 2015/0252960 A1* | 9/2015 | Song ................... | H05B 33/086 315/186 |

FOREIGN PATENT DOCUMENTS

| | | |
|---|---|---|
| JP | 2003044016 A | 2/2003 |
| JP | 2007078866 A | 3/2007 |
| KR | 100948057 B1 | 3/2010 |
| KR | 101169020 B1 | 7/2012 |
| KR | 101490174 B1 | 2/2015 |

OTHER PUBLICATIONS

International Search Report for PCT/KR2016/009147 dated Nov. 29, 2016.

* cited by examiner

*Primary Examiner* — Kenneth B Lee, Jr.
(74) *Attorney, Agent, or Firm* — Renaissance IP Law Group LLP

(57) ABSTRACT

A method of driving a display having a light emitting diode (LED) is provided. A driving pulse of a pulse width modulation method is applied to each pixel by a drive circuit, and a time for illuminating a red light, a blue light, and a green light, which are three primary colors, of each pixel is controlled, thereby controlling the luminance of the pixel.

6 Claims, 3 Drawing Sheets

(a)

(b)

METHOD FOR DRIVING DISPLAY

CROSS-REFERENCE TO RELATED APPLICATIONS

This application is a continuation-in-part of PCT/KR2016/009147, filed on Aug. 19, 2016, which claims priority under 35 USC § 119 to Korean Patent Application No. 10-2015-0116386, filed on Aug. 19, 2015 in the Korean Intellectual Property Office (KIPO), the contents of which are incorporated herein in its entirety by reference.

BACKGROUND

1. Technical Field

The present invention relates to a method of driving a display using a light emitting diode, and more particularly, to a method of driving a display capable of controlling color light combination and luminance of the display by controlling light emitting time for illuminating a multi-junction light emitting diode.

2. Description of the Related Art

Generally, a light emitting diode is developed and used as a display light source of various devices, and a light source thereof has straightness, low power consumption, and long lifetime. As technology is developed, a high brightness light emitting diode is manufactured and used.

The high brightness light emitting diode is very efficiently used for a safety display illumination of a portable illumination such as a flash light, a bicycle, etc. When the high brightness light emitting diodes are integrated, the integrated high brightness light emitting diodes can be used as a illumination lamp of high luminance.

The above-described light emitting diode is widely practicalized as a stand device of an illumination device used for studying, reading, etc., a mood lamp device installed on a wall for illuminating and for scenery of indoor or outdoor, a sensor illumination lamp device of an entrance, etc.

Methods for driving the light emitting diode as a light emitting device include a voltage control method and a current control method. In the voltage control method or the current control method, a predetermined voltage or a predetermined current is applied to the light emitting diode, and thus, the voltage control method or the current control method maintains a particular color or a luminance.

However, in the voltage and current control methods, current is greatly changed by a small change of the voltage, and thus, luminance is changed. Thus, characteristics of the display are deteriorated. Also, in the current control method, a nitride semiconductor device has an unstable ratio between efficiency and current. Thus, when a device is operated by a current of maximum efficiency, the efficiency is decreased.

SUMMARY

The purpose of the present invention is to provide a method of driving a display at a maximum efficiency of the display by controlling a light emitting time for illumination of a light emitting diode using a pulse width modulation control method to maximize efficiency of the display.

In a method of driving a display having a light emitting diode (LED), a driving pulse of a pulse width modulation method is applied to each pixel by a drive circuit, and a time for illuminating a red light, a blue light, and a green light, which are three primary colors, of each pixel is controlled, thereby controlling the luminance of the pixel.

A refresh cycle for illuminating the pixel may include a plurality of levels.

The red, green, and blue of the pixel in each refresh cycle may have one level selected from a minimum level to a maximum level.

Luminance of the pixel may be determined by combination of the red, blue, and green illuminated based on the times for illumination in the refresh period.

The drive circuit may apply a signal of a low level within a time corresponding to the minimum level to control the times for illuminating the red, blue, and green.

The times for illuminating the red, blue, and green may be simultaneously controlled by one drive circuit.

The times for illuminating the red, blue, and green may be controlled by three drive circuits, respectively.

The light emitting diode may include a multi junction light emitting diode (MJ LED), in which a plurality of layers illuminating different colors are combined.

According to the present invention, in the light emitting diode having a multi-junction structure formed of a nitride semiconductor, illumination time of each of three primary colors of light on each pixel is increased or decreased using a pulse width modulation method to control luminance of each pixel to control luminance of each pixel, and thus, luminance change caused by current change in a conventional current control method may be prevented. Also, the display may be operated at a current of the maximum efficiency, and thus, efficiency of the display may be maximized.

The technical effects of the present invention are not limited by the above-mentioned, and it would be obvious to those of ordinary skill in the art that other technical effects which are not mentioned also exist.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
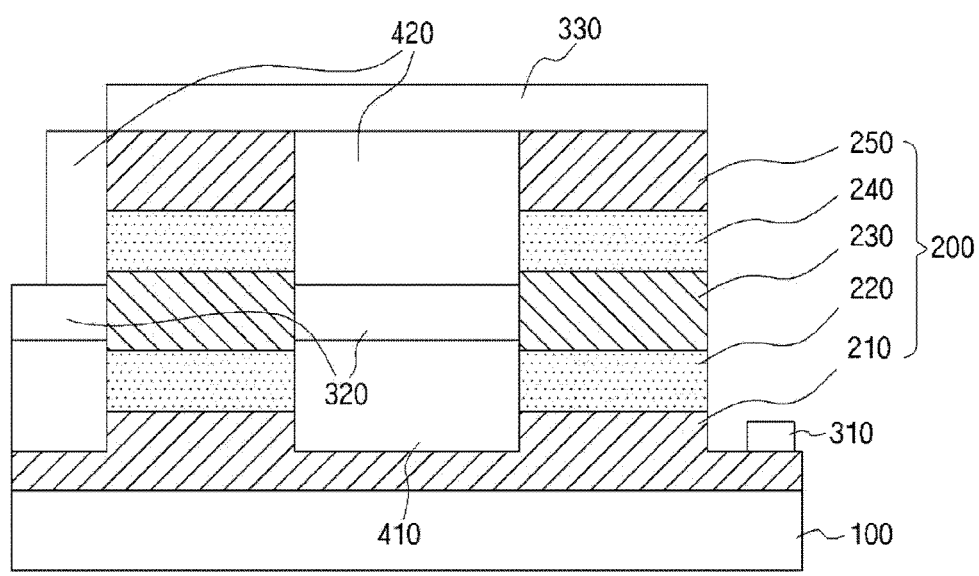
FIG. 1 is a cross-sectional view illustrating a light emitting diode having a multi-junction structure according to one embodiment of the present invention.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the following explanations of the present invention, if it is determined that detailed explanations concerning related known functions or structures cloud the main issue of the present invention, the detailed explanations will be omitted.

Hereinafter, embodiments of the present invention will be explained with reference to accompanying drawings. Same elements use the same reference numerals in the drawings, and any repetitive explanations concerning the same elements will be omitted.

FIG. 1 is a cross-sectional view illustrating a light emitting diode having a multi-junction structure according to one embodiment of the present invention.

Referring to FIG. 1, the light emitting diode according to the present invention includes a plurality of light emitting structures 200 formed on a substrate 100. Each of the light emitting structures 200 includes a first n-type semiconductor layer 210, a first light emitting layer 220, a p-type semiconductor layer 230, a second light emitting layer 240, and a second n-type semiconductor layer 250. Also, electrodes 310, 320, and 330 are connected to each of the light emitting structures 200. The electrodes include a first n-type electrode 310, a p-type electrode 320, and a second n-type electrode 330. The first n-type electrode 310 is electrically connected to the first n-type semiconductor layer 210, and the p-type electrode 320 is electrically connected to the p-type semiconductor layer 230, and the second n-type electrode 330 is electrically connected to the second n-type semiconductor layer 250. In particular, the p-type electrode 320 is formed in a separate space formed by the light emitting structures 200, and makes contact with a side surface of the p-type semiconductor layer 230.

The first n-type semiconductor layer 210 is formed on the substrate 100. The substrate 100 may be changed based on material of the first n-type semiconductor layer 210. For example, when the first n-type semiconductor layer 210 includes gallium nitride, the substrate 100 may include sapphire, gallium nitride, or zinc oxide. When the first n-type semiconductor layer 210 is doped by donors, the doping donors are determined by the material of the first n-type semiconductor layer 210.

The first light emitting layer 220 is formed on the first n-type semiconductor layer 210. Preferably, the first light emitting layer 220 may include a barrier layer and a well layer, which are alternately formed. When the first n-type semiconductor layer 210 includes gallium nitride, the barrier layer may preferably include gallium nitride.

The p-type semiconductor layer 230 is formed on the first light emitting layer 220. Acceptors are doped in the p-type semiconductor layer 230. The doping acceptors may be variously selected based on material of the p-type semiconductor layer 230.

The second light emitting layer 240 is formed on the p-type semiconductor layer 230. The second light emitting layer 240 may include a barrier layer and a well layer, which are alternately formed, and may be formed of the same material as the first light emitting layer 220. Also, in another embodiment, a bandgap engineering, which is different from that of the first light emitting layer 220, may be performed on the second light emitting layer 240. For example, the first light emitting layer 220 may generate light of a first color based on content of induced indium, and the second light emitting layer 240 may generate light of a second color, which is different from the first color.

The second n-type semiconductor layer 250 may be formed on the second light emitting layer 240. Preferably, the second n-type semiconductor layer 250 may have the same composition as the first n-type semiconductor layer 210.

The first n-type electrode 310 is formed on a side surface or an upper surface of the first n-type semiconductor layer 210. Also, a first passivation layer 410 is formed on the first n-type electrode 310, and the p-type electrode 320 is formed on an upper surface of the first passivation layer 410 and a side surface of the p-type semiconductor layer 230. Also, a second passivation layer 420 is formed on the p-type electrode 320, and the second n-type electrode 330 may be formed on an upper surface of the second passivation layer 420 or a side surface of the second n-type semiconductor layer. Also, according to another embodiment of the present invention, when the second n-type electrode 330 is formed on the side surface of the second n-type semiconductor layer 250, the uppermost surface of the second passivation layer 420 is not higher than the surface of the second n-type semiconductor layer 250.

In FIG. 1, the first n-type semiconductor layers 210 of the light emitting structures 200 are electrically connected to each other. Thus, the first n-type electrode 310 electrically connected to the first n-type semiconductor layer 210 is electrically connected to the first n-type semiconductor later 210 of the light emitting structure 200.

Also, the p-type electrode 320 formed on the first passivation layer 410 makes contact with a side surface of the p-type semiconductor layer 220. Also, the second n-type electrode 330 is electrically connected to the second n-type semiconductor later 250.

Thus, in the structure shown in FIG. 1, the plurality of light emitting structures 200 are connected to each other in parallel, and the n-type electrodes 310 and 330 are connected in parallel with respect to the p-type electrode 320.

The above-described multi-junction light emitting diode (MJ-LED) emits light of various colors using limited colors of the light emitting diode. In order to display the lights of the various colors using the limited colors of the light emitting diode, primary color lights such as red, green, and blue are used, and thus, all the colors sensed by human eyes may be displayed.

In order to emit the lights of the various colors using the lights of the three primary colors, the red, green, and blue colors of the multi-junction light emitting diode are individually controlled by a pulse width modulation. That is, in conventional methods, particular color and luminance are controlled through a voltage control method and a current control method, but in the conventional methods, current is greatly changed by a small change of the voltage, and thus, luminance may be greatly changed. Thus, characteristics of the display are deteriorated. Also, in the current control method, a nitride semiconductor device has an unstable ratio of between efficiency and current. Thus, when a device is operated by a current of maximum efficiency using the nitride semiconductor device, the efficiency is decreased again. Thus, the method of driving the display according to the present invention does not control using the voltage or the current but applies a driving pulse of the pulse width modulation method to each pixel, and times for illuminating the pixel by the lights of the three primary colors such as red, blue, and green are controlled, and thus, the luminance of the pixel may be controlled.

Figure 2:
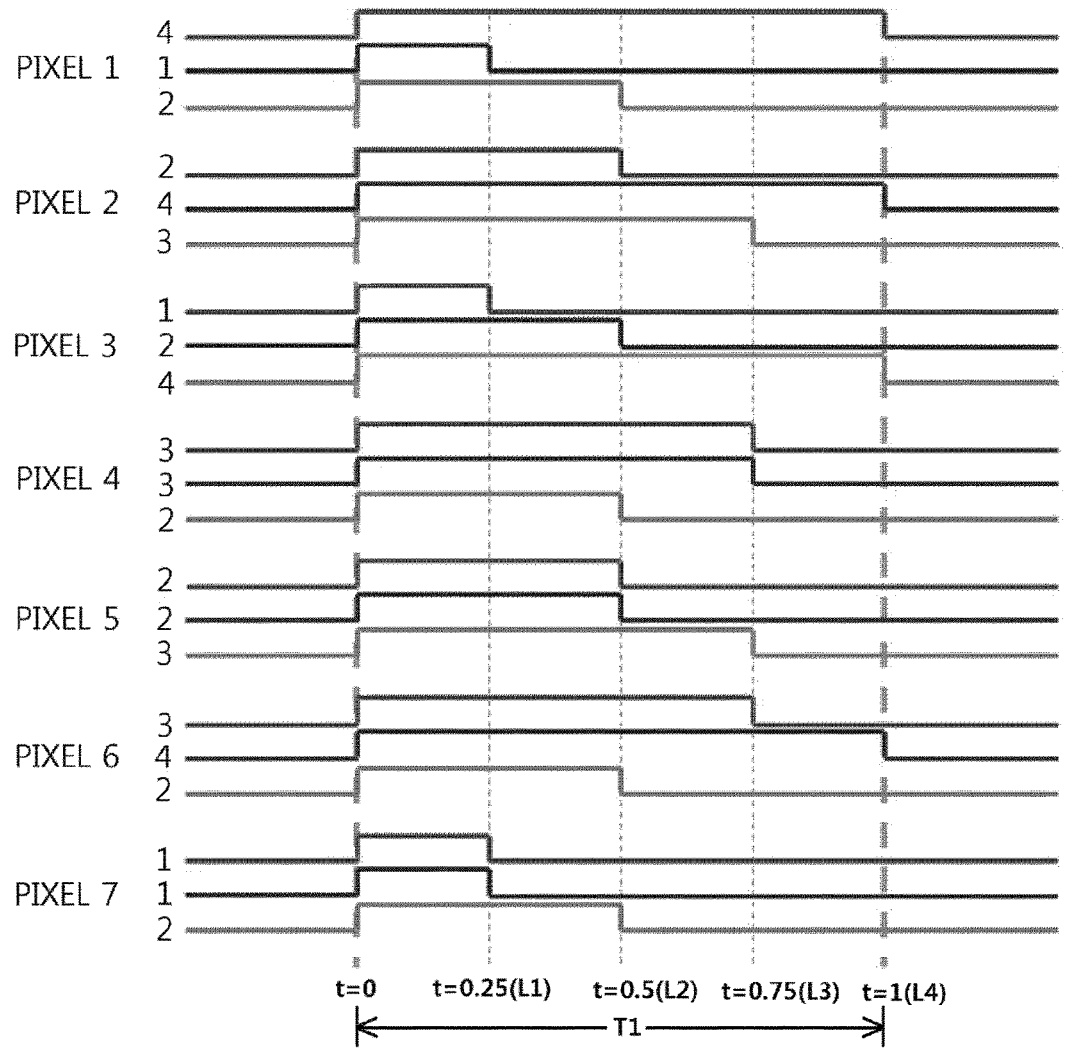
FIG. 2 is a waveform diagram illustrating a method of pulse width modulation according to one embodiment of a method of driving a display of the present invention.
Figure 3:
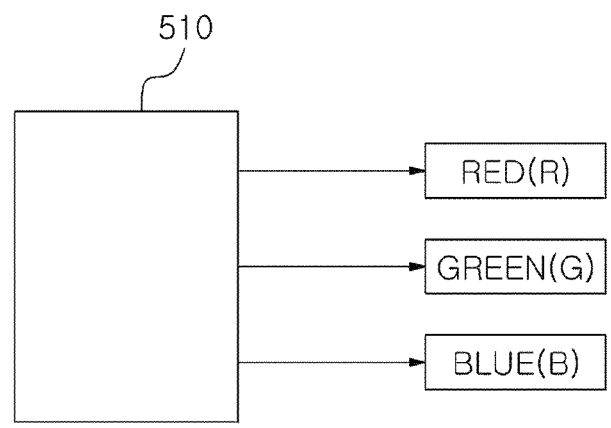
FIG. 3 is a block diagram illustrating a driving circuit realizing a method of driving a display according to one embodiment of the present invention.
Figure 3:
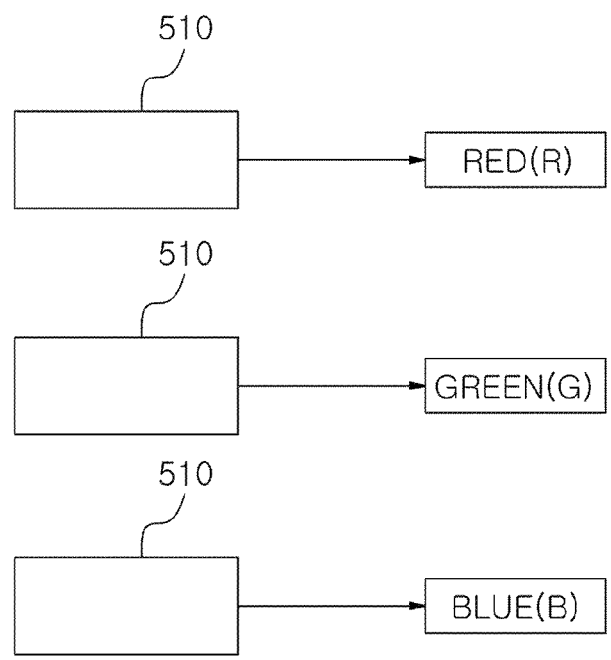

FIG. 2 is a waveform diagram illustrating a method of pulse width modulation according to one embodiment of a method of driving a display of the present invention. FIG. 3 is a block diagram illustrating a driving circuit realizing a method of driving a display according to one embodiment of the present invention.

Referring to FIGS. 2 and 3, FIG. 2 illustrates one example of the present invention for explaining a method of controlling a light emitting time, and explains the example of a pulse width modulation for realizing seven pixels configured to display colors using four levels. As shown in FIG. 2, in order to realize each of the pixels displaying the colors using the four levels, a refresh cycle T1 is divided into four levels to individually control red R, green G, and blue B through the pulse width modulation. That is, the refresh cycle T1 for illuminating the pixel may include a plurality of levels. Here, t=0 represents start of the refresh cycle T1, and t=1 represents end of the refresh cycle T1.

In each pixel, since the refresh cycle T1 from t=0 to t=1 is divided into the four levels to control the red R, green G, and blue B, the levels include t=0.25, t=0.5, t=0.75, and t=1. That is, each of the red R, green G, and blue B may include one level selected from the time of the first level t=0.25 to the time of the last level t=1 during the refresh cycle T1. Thus, the luminance of the pixel may be determined by color combination of the red R, green G, and blue B emitted during the light emitting time in the refresh cycle T1.

The method of driving the display according to the embodiment of the present will be explained.

As shown in FIG. 2, in a pixel 1, red R has a fourth level L4, and blue B has a first level L1, and green G has a second level L2. That is, the red R is illuminated during t=1, and blue B is illuminated during t=0.25, and green G is illuminated during t=0.5, and then, the pixel 1 is turned off by a signal of a low level of a drive circuit 510. Thus, in pixel 1, since the red R, blue B, and green G are respectively illuminated during the times of the 4th level L4, the 1st level L1, and the 2nd level L2, the light emitted from the pixel 1 during the refresh cycle T1 is determined by combination of the colors corresponding to the red R of the 4th level L4, the blue B of the 1st level L1, and the green G of the 2nd level L2.

In a pixel 2, red R has a second level L2, and blue B has a fourth level L4, and green G has a third level L3. That is, the red R is illuminated during t=0.5, and blue B is illuminated during t=1, and green G is illuminated during t=0.75, and then, the pixel 2 is then turned off by a signal of the low level of the drive circuit 510. Thus, in pixel 2, since the red R, blue B, and green G are respectively illuminated during the times of the 2nd level L2, the 4th level L4, and the 3rd level L3, the light emitted from the pixel 2 during the refresh cycle T1 is determined by combination of the colors corresponding to the red R of the 2nd level L2, the blue B of the 4th level L4, and the green G of the 3rd level L3.

In a pixel 3, red R has a first level L1, and blue B has a second level L2, and green G has a fourth level L4. That is, the red R is illuminated during t=0.25, and blue B is illuminated during t=0.5, and green G is illuminated during t=1, and then, the pixel 3 is then turned off by a signal of the low level of the drive circuit 510. Thus, in pixel 3, since the red R, blue B, and green G are respectively illuminated during the times of the 1st level L1, the 2nd level L2, and the 4th level L4, the light emitted from the pixel 3 during the refresh cycle T1 is determined by combination of the colors corresponding to the red R of the 1st level L1, the blue B of the 2nd level L2, and the green G of the 4th level L4.

In a pixel 4, red R and blue B have a third level L3, and green G has a second level L2. That is, the red R and the blue B are illuminated during t=0.75, and green G is illuminated during t=0.5, and then, the pixel 4 is then turned off by a signal of the low level of the drive circuit 510. Thus, in pixel 4, since the red R, blue B, and green G are respectively illuminated during the times of the 3rd level L3, the 3rd level L3, and the 2nd level L2, the light emitted from the pixel 4 during the refresh cycle T1 is determined by combination of the colors corresponding to the red R of the 3rd level L3, the blue B of the 3rd level L3, and the green G of the 2nd level L2.

In a pixel 5, red R and blue B have a second level L2, and green G has a third level L3. That is, the red R and the blue B are illuminated during t=0.5, and green G is illuminated during t=0.75, and then, the pixel 5 is then turned off by a signal of the low level of the drive circuit 510. Thus, in pixel 5, since the red R, blue B, and green G are respectively illuminated during the times of the 2nd level L2, the 2nd level L2, and the 3rd level L3, the light emitted from the pixel 5 during the refresh cycle T1 is determined by combination of the colors corresponding to the red R of the 2nd level L2, the blue B of the 2nd level L2, and the green G of the 3rd level L3.

In a pixel 6, red R has a third level L3, and blue B has a fourth level L4, and green G has a second level L2. That is, the red R is illuminated during t=0.75, and blue B is illuminated during t=1, and green G is illuminated during t=0.5, and then, the pixel 6 is then turned off by a signal of the low level of the drive circuit 510. Thus, in pixel 6, since the red R, blue B, and green G are respectively illuminated during the times of the 3rd level L3, the 4th level L4, and the 2nd level L2, the light emitted from the pixel 6 during the refresh cycle T1 is determined by combination of the colors corresponding to the red R of the 3rd level L3, the blue B of the 4th level L4, and the green G of the 2nd level L2.

In a pixel 7, red R and blue B have a first level L1, and green G has a second level L2. That is, the red R and the blue B are illuminated during t=0.25, and green G is illuminated during t=0.5, and then, the pixel 7 is then turned off by a signal of the low level of the drive circuit 510. Thus, in pixel 7, since the red R, blue B, and green G are respectively illuminated during the times of the 1st level L1, the 1st level L1, and the 2nd level L2, the light emitted from the pixel 7 during the refresh cycle T1 is determined by combination of the colors corresponding to the red R of the 1st level L1, the blue B of the 1st level L1, and the green G of the 2nd level L2.

As described above, in order to control the red R, blue B, and green G based on corresponding level, the drive circuit 510 applies the signal of the low level within the time corresponding to the minimum level, and thus, the light emitting time may be controlled. That is, in the embodiment shown in FIG. 2, the drive circuit 510 may apply the signal of the first level L1 to the red R of the pixels 3 and 7, and may apply the signal of the low level to the blue B of the pixels 1 and 7, and may not apply any signal to the green G. The driving circuit 510 may apply the signal of the second level L2 to the red R of the pixels 2 and 5 and the blue B of the pixels 3 and 5, and may apply the signal of the low level to the green G of the pixels 1, 4, 6, and 7. The driving circuit 510 may apply the signal of the third level L3 to the red R of the pixels 4 and 6 and the blue B of the pixel 4, and may apply the signal of the low level to the green G of the pixels 2 and 5. The driving circuit 510 may apply the signal of the fourth level L4 to the red R of the pixel 1 and the blue B of the pixels 2 and 6, and may apply the signal of the low level to the green G of the pixel 3. As described above, in the method of controlling the light emitting time of the red R, blue B, and green G using the drive circuit 510, the three colors may be controlled using one drive circuit 510 shown in FIG. 3A, or may be respectively controlled using three drive circuits 510 shown in FIG. 3B.

In the embodiment of the present invention, the method of driving the seven pixels of the four levels is described, but the method may control 256 light emitting times of 256 gray scales for 256 pixels. Thus, when the number of the pixels is 256, the refresh time is divided into 256, and the drive circuit may on/off control each of the pixels at a refresh rate of 256 Hz.

According to the present invention, the method of driving the display of the light emitting diode uses the pulse width modulation, and the light emitting time of the lights of the three primary colors is individually increased or decreased, thereby controlling the luminance of each pixel. That is, the refresh cycle T1 for illuminating the red R, blue B, and green G is divided into a plurality of levels for forming colors, and the control signals of the pulse width modulation are applied to the pixels by the drive circuit 510 to illuminate each of the colors, and then, the colors of the pixels are turned off by the signal of the low level at the corresponding level. Thus, the times for illuminating the red R, blue B, and green G are controlled in each pixel, and desired color may be illuminated by the combination of the times for illuminating the red R, blue B, and green G. Also, different from the conventional voltage or current control method, illumination time of each of three primary colors of light on each pixel is controlled, and thus, luminance change caused by current change in a conventional current control method may be prevented. Also, the display may be operated at a current of the maximum efficiency, and thus, efficiency of the display may be maximized.

The embodiments described in the specification and the drawings of the present invention are particular embodiments to help understandings of the present invention, and is not intend to limit the scope of the present invention. It would be obvious to those of ordinary skill in the art that the above embodiments are to cover all modifications, equivalents, and alternatives falling within the scope of the invention. Accordingly, it will be understood that various changes in form and details may be made therein without departing from the spirit and scope of the following claims.

What is claimed is:

1. A method of driving a display having a light emitting diode (LED), comprising:
   applying a driving pulse to each of pixels using a driving circuit through a pulse width modulation method to control times for illuminating lights of primary colors having red, green, and blue of each pixel,
   wherein the light emitting diode comprises a multi junction light emitting diode, in which a plurality of layers configured to illuminate different colors are combined, and
   wherein the multi junction light emitting diode has a first n-type semiconductor layer formed on a substrate, a first light emitting layer formed on the first n-type semiconductor layer for generating light of a first color, a p-type semiconductor layer formed on the first light emitting layer, a second light emitting layer formed on the p-type semiconductor layer for generating light of a second color different from the first color, and a second n-type semiconductor layer formed on the second light emitting layer, and
   wherein a plurality of levels correspond to a plurality of turn-on durations of each pixel, which correspond to an amount of light emission defined in one refresh cycle for light generation.

2. The method of claim 1, wherein the red, green, and blue of the pixel in each refresh cycle has one level selected from a minimum level to a maximum level.

3. The method of claim 1, wherein luminance of the pixel is determined by combination of the red, blue, and green illuminated based on the times for illumination in the refresh cycle.

4. The method of claim 2, wherein the drive circuit applies a signal of a low level within a time corresponding to the minimum level to control the times for illuminating the red, blue, and green.

5. The method of claim 1, wherein the times for illuminating the red, blue, and green are simultaneously controlled by one drive circuit.

6. The method of claim 1, wherein the times for illuminating the red, blue, and green are controlled by three drive circuits, respectively.

* * * * *